(12) United States Patent
Lu et al.

(10) Patent No.: US 11,017,934 B2
(45) Date of Patent: May 25, 2021

(54) ELECTRONIC MODULE

(71) Applicant: CYNTEC CO., LTD., Hsinchu (TW)

(72) Inventors: Bau-Ru Lu, Changhua County (TW); Chun Hsien Lu, Hsinchu (TW); Da-Jung Chen, Taoyuan (TW)

(73) Assignee: CYNTEC CO., LTD., Hsinchu (TW)

( * ) Notice: Subject to any disclaimer, the term of this patent is extended or adjusted under 35 U.S.C. 154(b) by 486 days.

(21) Appl. No.: 15/835,486

(22) Filed: Dec. 8, 2017

(65) Prior Publication Data

US 2018/0166200 A1   Jun. 14, 2018

Related U.S. Application Data

(60) Provisional application No. 62/431,838, filed on Dec. 9, 2016.

(51) Int. Cl.
| | | |
|---|---|---|
| *H01F 27/02* | (2006.01) | |
| *H01F 27/28* | (2006.01) | |
| *H01F 41/00* | (2006.01) | |
| *H01F 27/32* | (2006.01) | |
| *H01F 27/36* | (2006.01) | |
| *H01F 27/24* | (2006.01) | |
| *H01F 17/04* | (2006.01) | |
| *H05K 1/11* | (2006.01) | |
| *H05K 1/14* | (2006.01) | |
| *H05K 1/18* | (2006.01) | |

(52) U.S. Cl.
CPC .......... *H01F 27/022* (2013.01); *H01F 17/04* (2013.01); *H01F 27/24* (2013.01); *H01F 27/28* (2013.01); *H01F 27/2823* (2013.01); *H01F 27/32* (2013.01); *H01F 27/36* (2013.01); *H01F 41/00* (2013.01); *H05K 1/111* (2013.01); *H05K 1/144* (2013.01); *H05K 1/181* (2013.01); *H05K 1/115* (2013.01); *H05K 2201/041* (2013.01); *H05K 2201/09063* (2013.01); *H05K 2201/1003* (2013.01); *H05K 2201/10015* (2013.01); *H05K 2201/10522* (2013.01); *H05K 2201/10545* (2013.01)

(58) Field of Classification Search
USPC .................................. 336/200, 232, 192
See application file for complete search history.

(56) References Cited

U.S. PATENT DOCUMENTS

| | | | |
|---|---|---|---|
| 2016/0217917 A1* | 7/2016 | Jeong | ............. H01F 27/292 |
| 2017/0196091 A1* | 7/2017 | Lee | ............. H05K 1/181 |
| 2017/0372833 A1* | 12/2017 | Jang | ............. H01F 27/29 |

* cited by examiner

*Primary Examiner* — Shawki S Ismail
*Assistant Examiner* — Kazi S Hossain
(74) *Attorney, Agent, or Firm* — Min-Lee Teng; Litron Patent & Trademark Office

(57) ABSTRACT

The present invention discloses an electronic module. The electronic module comprises: a substrate, having a top surface and a bottom surface; a plurality of coils on the top surface of the substrate, wherein each coil comprises a corresponding first end and a corresponding second end; and a molding body, disposed on the substrate to encapsulate said coils, wherein said corresponding first end and said corresponding second end of each coil are electrically coupled to a corresponding first electrode and a corresponding second electrode of the electronic module.

18 Claims, 10 Drawing Sheets

ELECTRONIC MODULE

CROSS-REFERENCE TO RELATED APPLICATION

This application claims the benefit of U.S. provisional patent application No. 62/431,838, filed on Dec. 9, 2016, which is hereby incorporated herein by reference.

BACKGROUND OF THE INVENTION

1. Field of the Invention

The present invention relates to an electronic module, and more particularly to an electronic module in which the different coils used in the different independent circuits are integrated into a single product.

2. Description of Related Art

The inductor is a passive electronic component which stores energy in the form of a magnetic field. In its simplest form, the inductor includes a coil. The inductance of the inductor is directly proportional to the number of turns in the coil. The inductance of the inductor also depends on the radius of the coil and the material around which the coil is wound. However, the coils with different inductances respectively used in the different independent circuits not only increase the cost but also increase the volume of the system and complexity of layout. Therefore, the technical proposal is needed to solve above problems in the industry.

SUMMARY OF THE INVENTION

The present invention discloses an electronic module comprising the coils with different inductances on a substrate. The coils can be respectively used in the different independent circuits to solve above problems to further reduce the volume of the system and complexity of layout.

In one embodiment, an electronic module comprises: a substrate, having a top surface and a bottom surface; a plurality of coils on the top surface of the substrate, wherein each coil comprises a corresponding first end and a corresponding second end; and a molding body, disposed on the substrate to encapsulate said coils, wherein said corresponding first end and said corresponding second end of each coil are electrically coupled to a corresponding first electrode and a corresponding second electrode of the electronic module.

In one embodiment, a gap is formed in the molding body between a first coil and a second coil, wherein a non-magnetic material is disposed in said gap.

In one embodiment, said gap extends from the top surface of the molding body to the top surface of the substrate.

In one embodiment, said corresponding first electrode and said corresponding second electrode of each coil are disposed on the bottom surface of the substrate.

In one embodiment, said non-magnetic material is epoxy or metal material.

In one embodiment, each coil forms an inductor and at least two inductors have two different inductances.

In one embodiment, each coil is formed by a conductor wire.

In one embodiment, each coil is formed by at least one conductive layer.

In one embodiment, the molding body comprises a magnetic material.

In one embodiment, the molding body comprises a magnetic material that extends into the hollow space of each coil.

In one embodiment, a magnetic core is disposed inside the hollow space of each coil.

In one embodiment, said magnetic core is a T-core.

In one embodiment, said magnetic core is an I-core.

In one embodiment, the molding body encapsulates the lateral surfaces of the substrate.

In one embodiment, the molding body encapsulates the lateral surfaces of the substrate and the partial bottom surface, wherein said electrodes are disposed on the bottom surface of the substrate and exposed from the molding body.

In one embodiment, at least one conductive layer is disposed on the top surface of molding body, and at least one device is disposed over the top surface of the molding body and electrically connected to the at least one conductive layer.

In one embodiment, every inductor has a different inductance.

In one embodiment, at least one conductive layer and at least one insulating layer are disposed on the bottom surface of substrate, and at least one device is disposed in the at least one conductive layer and the at least one insulating layer, wherein the at least one device is electrically connected to the at least one conductive layer, wherein said electrodes are disposed on the bottom surface of said at least one insulating layer.

In one embodiment, an electronic module comprises: a substrate, having a top surface and a bottom surface; a plurality of coils on the top surface of the substrate, wherein each coil comprises a corresponding first end and a corresponding second end; and a molding body, disposed on the substrate to encapsulate said coils, wherein said corresponding first end and said corresponding second end of each coil are electrically coupled to a corresponding first contact point and a corresponding second contact point on the substrate.

In one embodiment, a gap is formed in the molding body between a first coil and a second coil, wherein a non-magnetic material is disposed in said gap.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF THE ILLUSTRATED EMBODIMENTS

The detailed explanation of the present invention is described as follows. The described preferred embodiments are presented for purposes of illustrations and description and they are not intended to limit the scope of the present invention.

Figure 1:
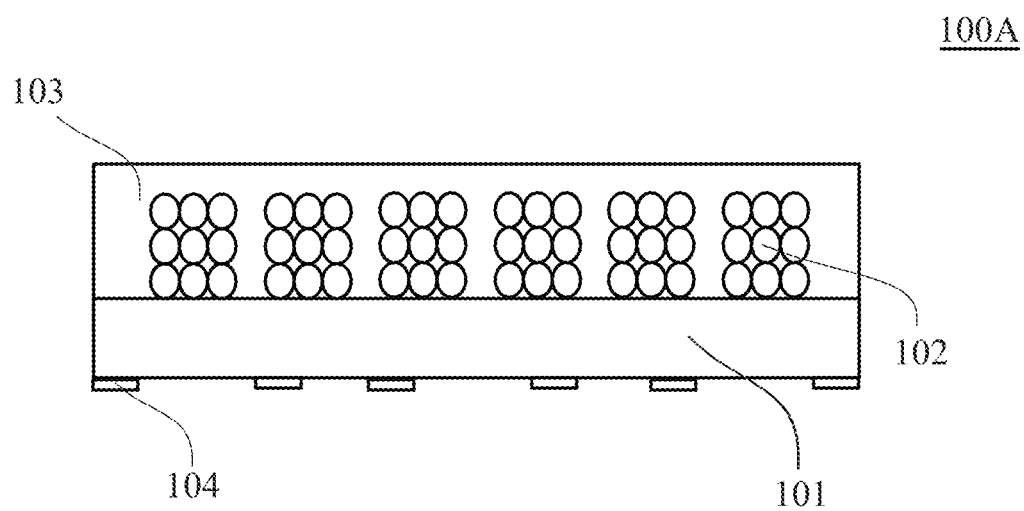
FIG. 1 illustrates a schematic cross-sectional view of an electronic module in the present invention.

FIG. 1 illustrates a schematic cross-sectional view of an electronic module 100A in one embodiment of the present invention. The electronic module 100A comprises a substrate 101, a plurality of coils 102 and a first molding body 103. The coils 102 are disposed on the substrate 101. In one embodiment, the substrate 101 is a lead frame, a PCB, a metallic substrate or a ceramic substrate; however, the substrate 101 of the present invention is not limited to these arrangements. Each coil 102 can be wound around a magnetic core. The magnetic core (e.g., T-core or I-core) can be disposed inside the hollow space of each coil 102. The electronic module 100A including the different coils 102 used in the different independent circuits can be integrated into a single product which can be designed for the customers need. The coil 102 can have any suitable shape (e.g., spiral). The substrate 101 can comprise multi-layer circuits and the bottom layer of the substrate 101 can be used for defining pins. Each coil 102 can form an inductor and at least two inductors have two different inductances. Each inductor can have a different inductance. The coils 102 or the inductors can be formed on the substrate 101 by SMT technology. Each coil 102 can be formed by a conductor wire which can comprise at least one conductive layer. Each coil 102 comprises a corresponding first end and a corresponding second end for electrical connection. The first molding body 103 is disposed on the substrate 101 to encapsulate the coils 102. The first molding body 103 can be formed by transfer molding or hot pressing. The first molding body 103 comprises a magnetic material. The magnetic material can be extended into the hollow space of each coil 102. Optionally, the first molding body 103 can be extended to the lateral surfaces of the substrate 101 to encapsulate the lateral surfaces of the substrate 101. The corresponding first end and the corresponding second end of each coil 102 are electrically coupled to a corresponding first electrode 104 and a corresponding second electrode 104 of the electronic module 100A for external electrical connection, or the corresponding first end and the corresponding second end of each coil 102 are electrically coupled to a corresponding first contact point 104 and a corresponding second contact point 104 on the substrate 101 so that the contact points can be used to connect with other electronic devices in the electronic module 100A. The corresponding first electrode and the corresponding second electrode of each coil 102 can be disposed on the bottom surface of the substrate 101. Optionally, the first molding body 103 can be extended to the lateral surfaces and the partial bottom surface of the substrate 101 to encapsulate the lateral surfaces and the partial bottom surface of the substrate 101 (not shown). The electrodes can be disposed on the bottom surface of the substrate 101 and exposed from the first molding body 103. As shown in FIG. 1, the coils 102 are placed horizontally on the substrate 101 without stacking over one another vertically and without electrically connecting with one another.

Figure 2:
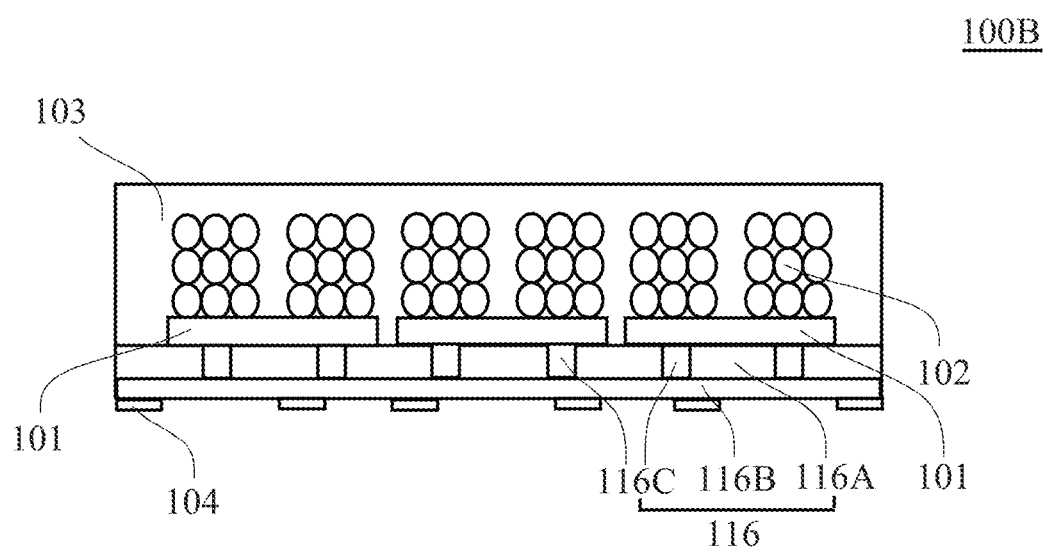
FIG. 2 illustrates a schematic cross-sectional view of an electronic module in the present invention, wherein the substrate has a least one vacancy therein and the substrate is a lead frame preferably.

FIG. 2 illustrates a schematic cross-sectional view of an electronic module 100B in one embodiment of the present invention, wherein the substrate 101 has a least one vacancy therein and the substrate 101 is a lead frame preferably. However, the substrate 101 of the present invention is not limited to this case; for example, the substrate 101 can be a PCB, a metallic substrate or a ceramic substrate. The coils 102 are disposed on the lead frame 101 and the lead frame 101 can be optionally disposed on the RDL (Redistribution Layer) body 116 formed by a first RDL (Redistribution Layer) process. The RDL body 116 can comprise a lamination material 116A, a solder mask 116B and a plurality of vias 116C. The lamination material 116A is disposed between the lead frame 101 and the solder mask 116B, and a plurality of vias 116C are used for electrical connection in the RDL body 116. However, the RDL body 116 of the present invention is not limited to this case. A plurality of contact points such as pads 104 (e.g., Ni/Au pad) can be formed on the bottom surface of the RDL body 116 for electrically connecting the pins of the bottom layer of the substrate (or lead frame) 101 to a PCB or another conductive element (not shown), such as IC chip, MOSFET, IGBT, diode, resistor, choke or capacitor.

Figure 3A:
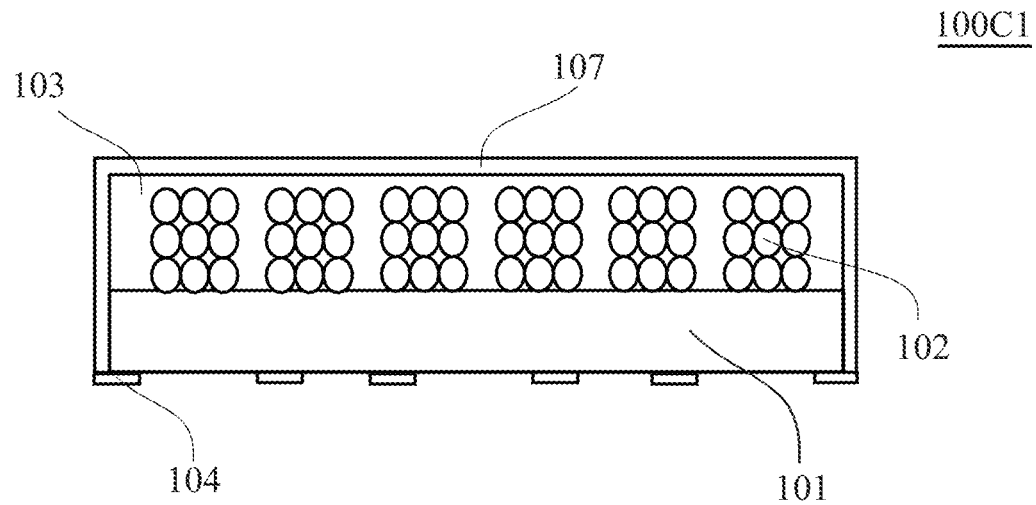
FIG. 3A and FIG. 3B respectively illustrates a schematic cross-sectional view of an electronic module in another embodiment of the present invention, wherein the electronic module further comprises a shielding layer.
Figure 3B:
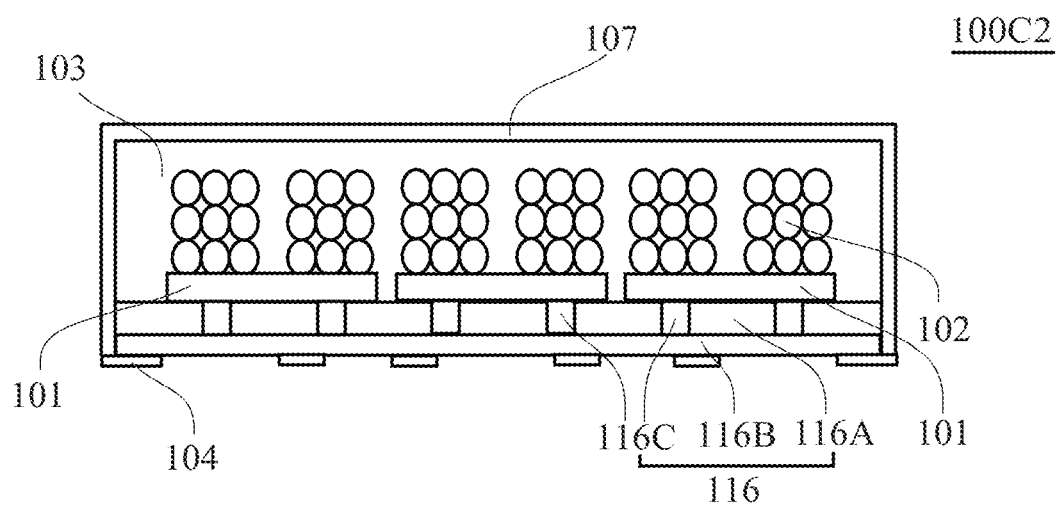
Figure 4A:
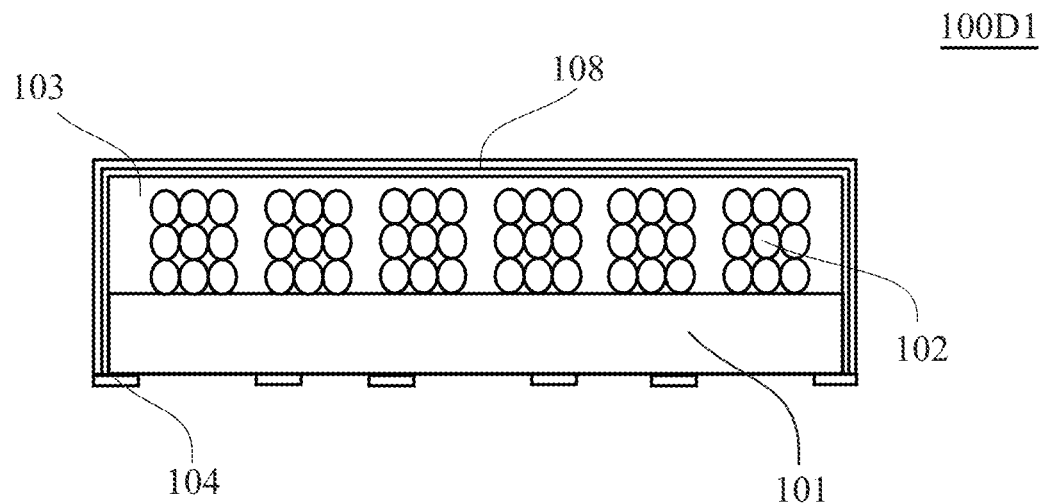
FIG. 4A and FIG. 4B respectively illustrates a schematic cross-sectional view of an electronic module in another embodiment of the present invention, wherein the electronic module further comprises EMC (Epoxy Molding Compound) molding.
Figure 4B:
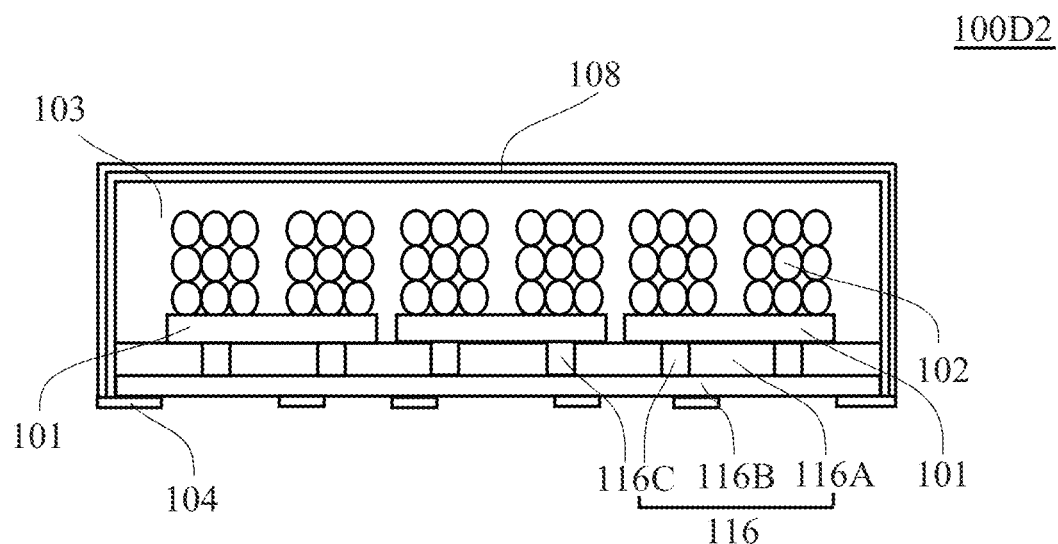
Figure 5A:
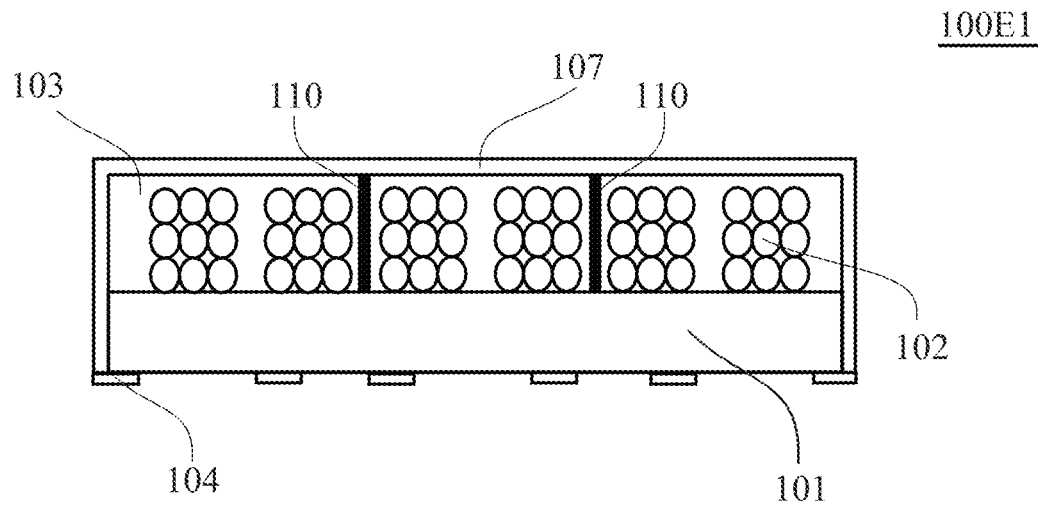
FIG. 5A and FIG. 5B respectively illustrates a schematic cross-sectional view of an electronic module in another embodiment of the present invention, wherein the gap is formed between the adjacent coils.
Figure 5B:
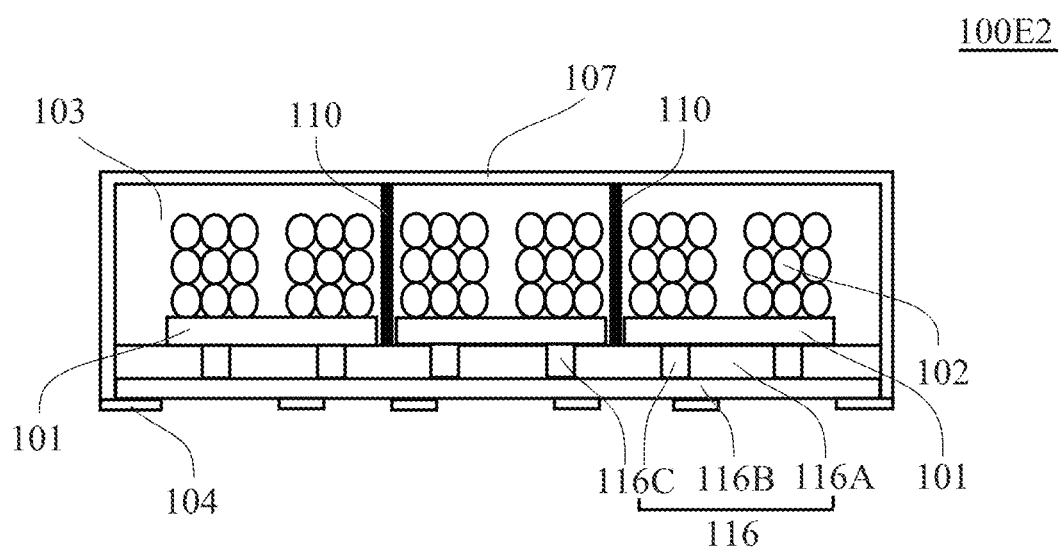

FIG. 3A illustrates a schematic cross-sectional view of an electronic module 100C1 in another embodiment of the present invention. Compared to the electronic module 100A in FIG. 1, the shielding layer 107 can be the outermost layer of the electronic module 100C1 to inhibit or reduce EMI. FIG. 3B illustrates a schematic cross-sectional view of an electronic module 100C2 in another embodiment of the present invention. Compared to the electronic module 100B in FIG. 2, the shielding layer 107 can be the outermost layer of the electronic module 100C2 to inhibit or reduce EMI. The shielding layer 107 can be formed by sputtering. Optionally, the shielding layer 107 can be extended to the lateral surfaces of the substrate 101 or the lateral surfaces of the first molding body 103. FIG. 4A illustrates a schematic cross-sectional view of an electronic module 100D1 in another embodiment of the present invention. Compared to the electronic module 100A in FIG. 1, EMC (Epoxy Molding Compound) molding 108 can be regarded as the outermost layer of the electronic module 100D1 to protect the electronic module 100D from the environment factors such as moisture, heat, and shock. FIG. 4B illustrates a schematic cross-sectional view of an electronic module 100D2 in another embodiment of the present invention. Compared to the electronic module 100B in FIG. 2, EMC (Epoxy Molding Compound) molding 108 can be regarded as the outermost layer of the electronic module 100D2 to protect the electronic module 100D2 from the environment factors such as moisture, heat, and shock. Optionally, EMC molding 108 can be extended to the lateral surfaces of the substrate 101 or the lateral surfaces of the first molding body 103. FIG. 5A illustrates a schematic cross-sectional view of an electronic module 100E1 in another embodiment of the present invention. FIG. 5B illustrates a schematic cross-sectional view of an electronic module 100E2 in another embodiment of the present invention. Because the different coils 102 used in the different independent circuits are integrated into the electronic module in the present invention, the adjacent different coils 102 used in the different independent circuits will interact with each other resulting from closeness. In order to overcome the interaction resulting from closeness, the gap 110 can be formed between the adjacent coils 102 to reduce interaction, such as the mutual inductance between adjacent coils 102. The gap 110 can extend from the top surface of the first molding body 103 to the top surface of the substrate 101. The gap 110 can be filled with a non-magnetic material, such as epoxy or metal material.

The substrate 101 having a least one vacancy therein in FIG. 2 is used in the following embodiments for convenience of description. However, the bulk substrate 101 in FIG. 1 can be also used in the following embodiments according to the configuration of the electronic module and it is not shown therein.

Figure 6A:
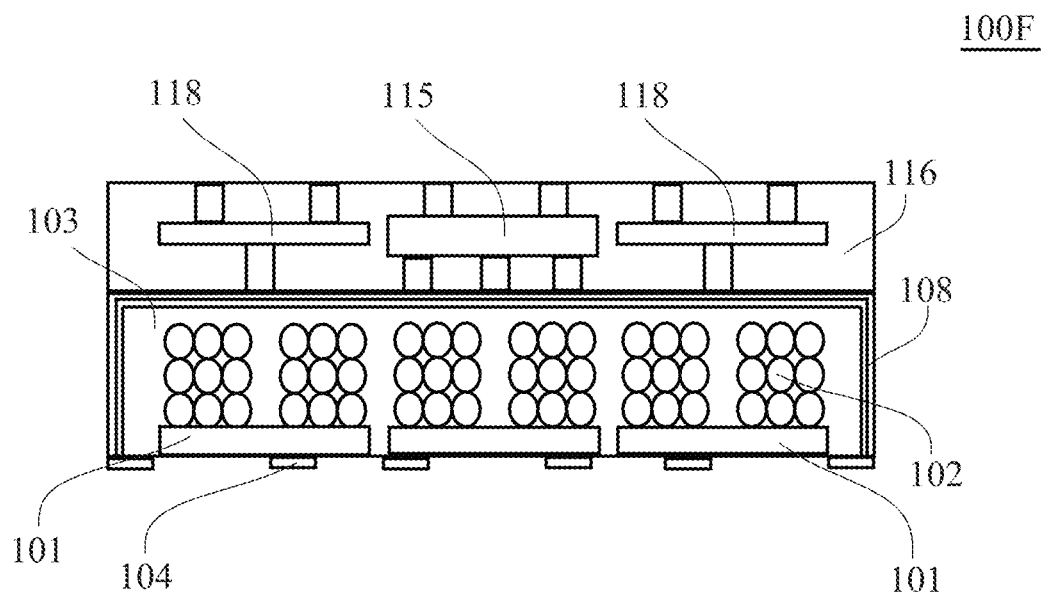
FIG. 6A to FIG. 6D respectively illustrates a schematic cross-sectional view of an electronic module in another embodiment of the present invention, wherein at least one first device can be disposed in the electronic module.
Figure 6B:
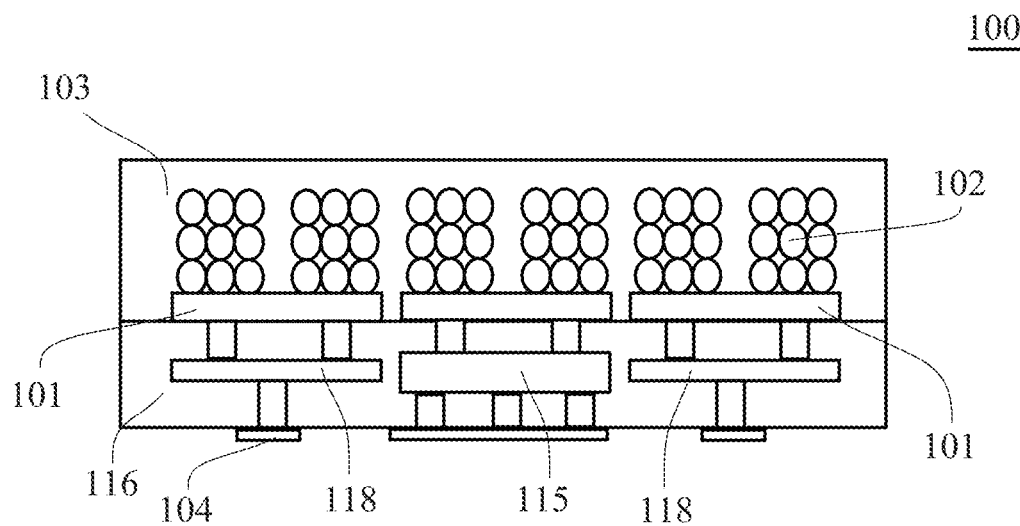
Figure 6C:
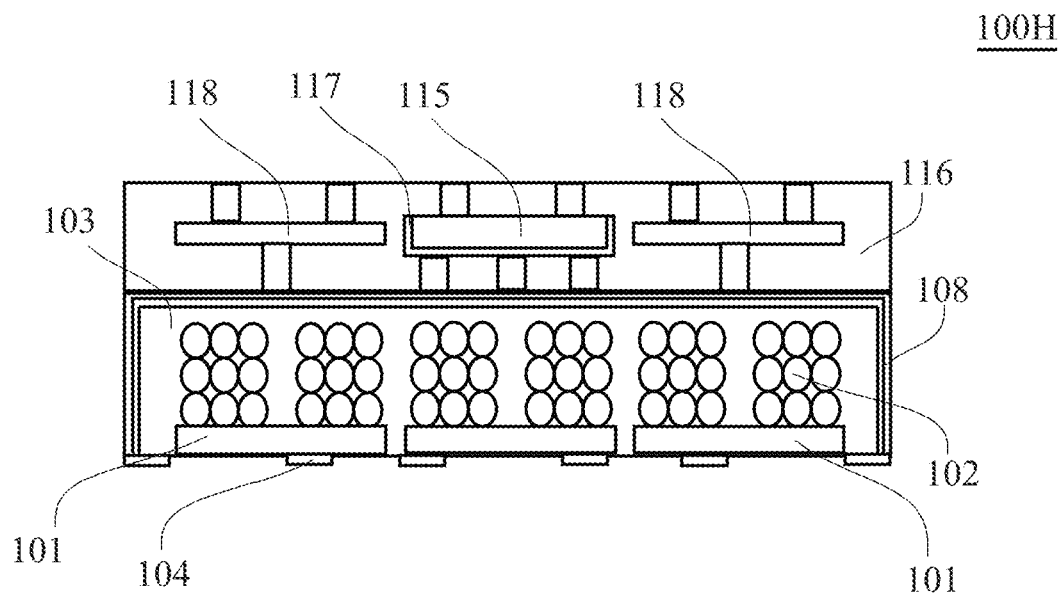
Figure 6D:
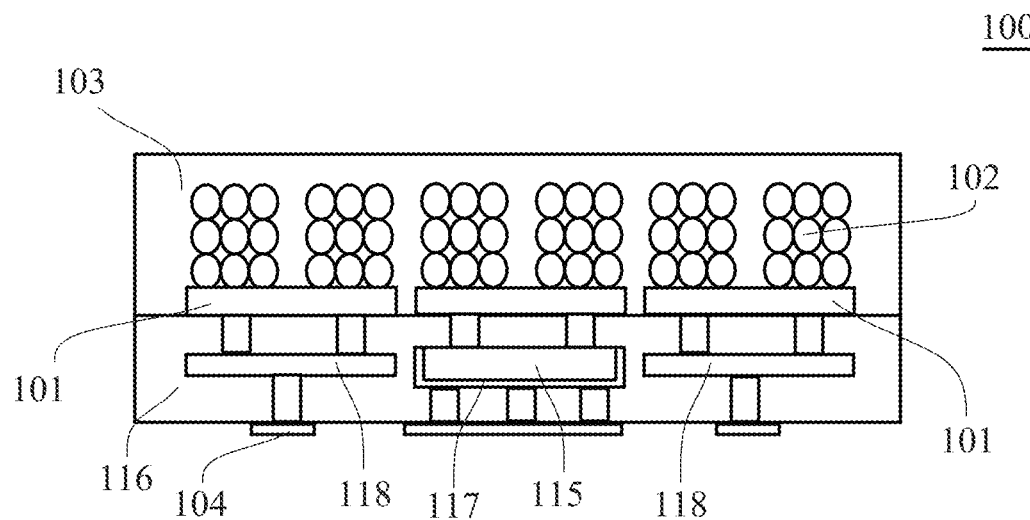

FIG. 6A and FIG. 6B respectively illustrates a schematic cross-sectional view of an electronic module 100F, 100G in another embodiment of the present invention. Compared to the electronic module 100A in FIG. 1, at least one first device 115 can be disposed in the electronic module 100F, 100G by a first RDL (Redistribution Layer) process to design the circuit the customers need. At least one first device 115 and its related circuits can be embedded in the RDL body 116. The I/O terminals of each embedded first device 115 may be exposed from the RDL body 116. The embedded first device 115 can be a bare die or any other device. The first RDL process can be performed in the top portion of the electronic module 100F (see FIG. 6A). In one embodiment, at least one conductive layer can be disposed over the top surface of the first molding body 103, and at least one first device 115 can be disposed over the top surface of the first molding body 103 and electrically connected to at least one conductive layer. The first RDL process can be performed in the bottom portion of the electronic module 100G (see FIG. 6B). In one embodiment, at least one conductive layer and at least one insulating layer can be disposed over the bottom surface of the first molding body 103, and at least one device 115 can be disposed in at least one conductive layer and at least one insulating layer, wherein at least one first device 115 is electrically connected to at least one conductive layer. In another embodiment, at least one conductive layer and at least one insulating layer can be disposed over the bottom surface of the substrate 101, and at least one device 115 can be disposed in at least one conductive layer and at least one insulating layer, wherein at least one first device 115 is electrically connected to at least one conductive layer. The electrodes can be disposed on the bottom surface of at least one insulating layer. The first RDL process can be performed in the top portion and the bottom portion of the electronic module (i.e. a combination of the electronic module 100F in FIG. 6A and the electronic module 100G in FIG. 6B, not shown). The embedded first device 115 can be disposed on the chip holder 117 formed by half-etching (see FIG. 6C and FIG. 6D). In FIG. 6A to FIG. 6D, specifically, at least one embedded first device 115 is disposed on the center of the top portion of the electronic module 100F, 100H or on the center of the bottom portion of the electronic module 100G, 100I and two lead frames 118 are disposed on both two sides of the embedded first device 115; however, the present invention is not limited to this arrangement.

In one embodiment, the shielding layer 107 in FIG. 3A and FIG. 3B or EMC molding 108 in FIG. 4A and FIG. 4B can be disposed in the electronic module 100F, 100G, 100H, 100I in FIG. 6A to FIG. 6D (not shown). In this case, the shielding layer 107 or EMC molding 108 can be extended to the lateral surfaces of the substrate 101, the lateral surfaces of the first molding body 103 or the lateral surfaces of the RDL body 116 to encapsulate the lateral surfaces of the substrate 101, the lateral surfaces of the first molding body 103 or the lateral surfaces of the RDL body 116. Moreover, the gap 110 can be formed between the adjacent coils 102 to reduce interaction of the adjacent coils 102 resulting from closeness in FIG. 6A to FIG. 6D (not shown).

Figure 7A:
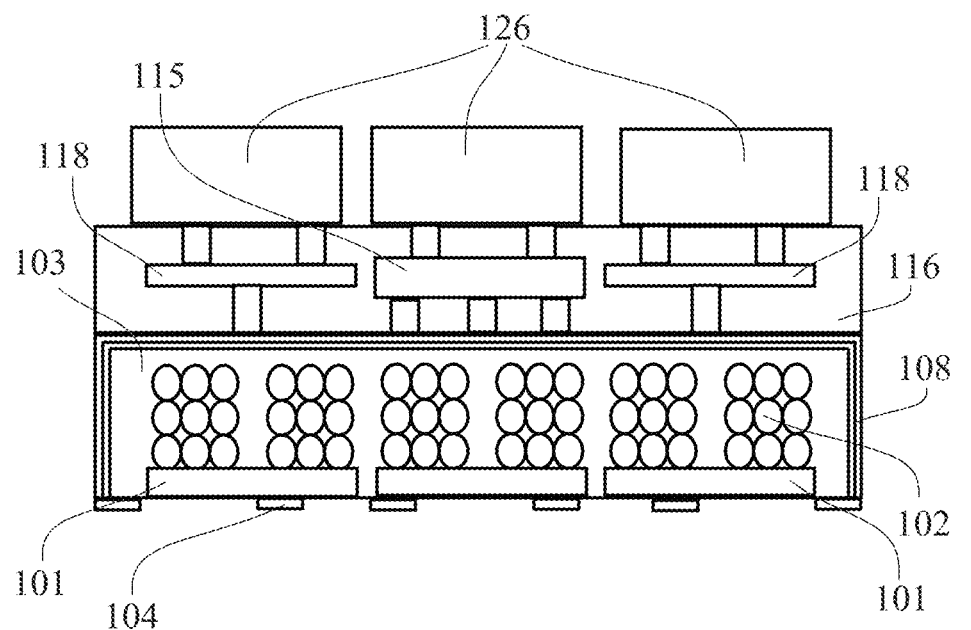
FIG. 7A to FIG. 7D respectively illustrates a schematic cross-sectional view of an electronic module in another embodiment of the present invention, wherein at least one second device can be disposed in the electronic module.
Figure 7B:
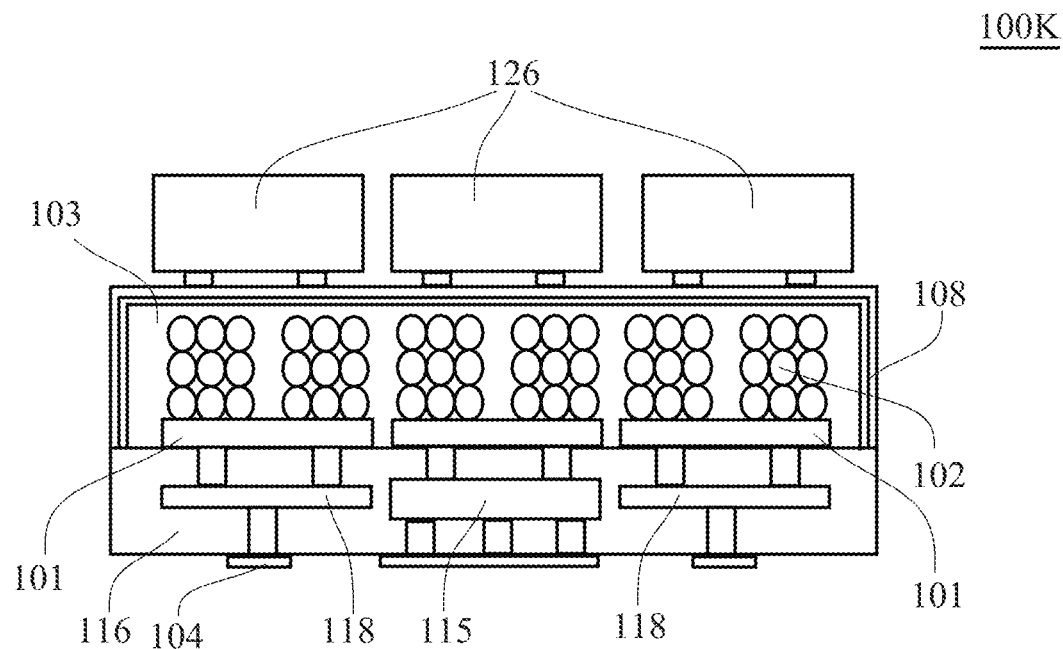
Figure 7C:
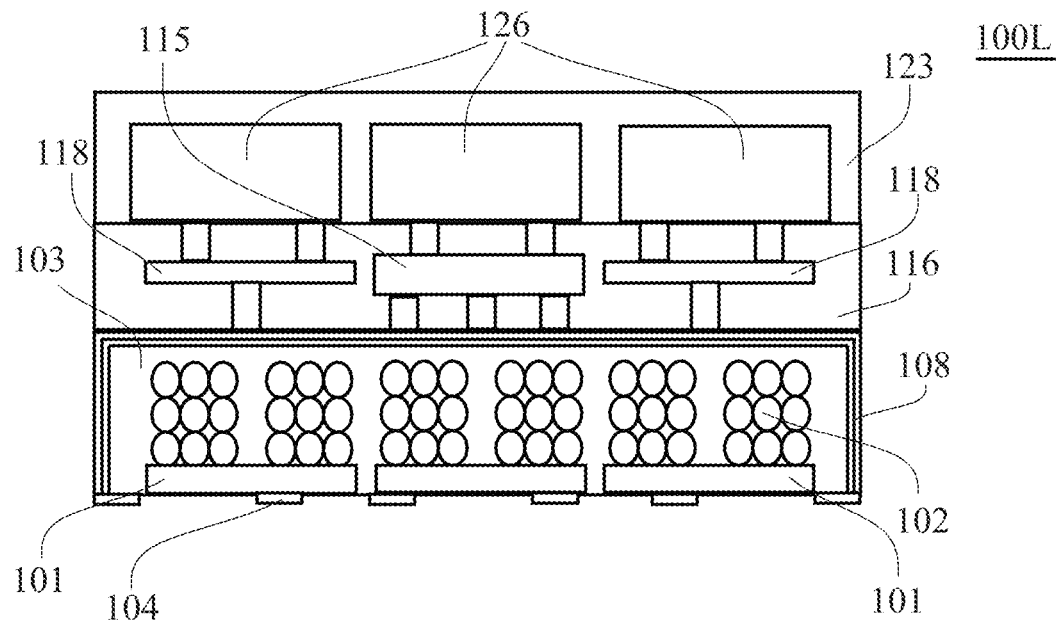
Figure 7D:
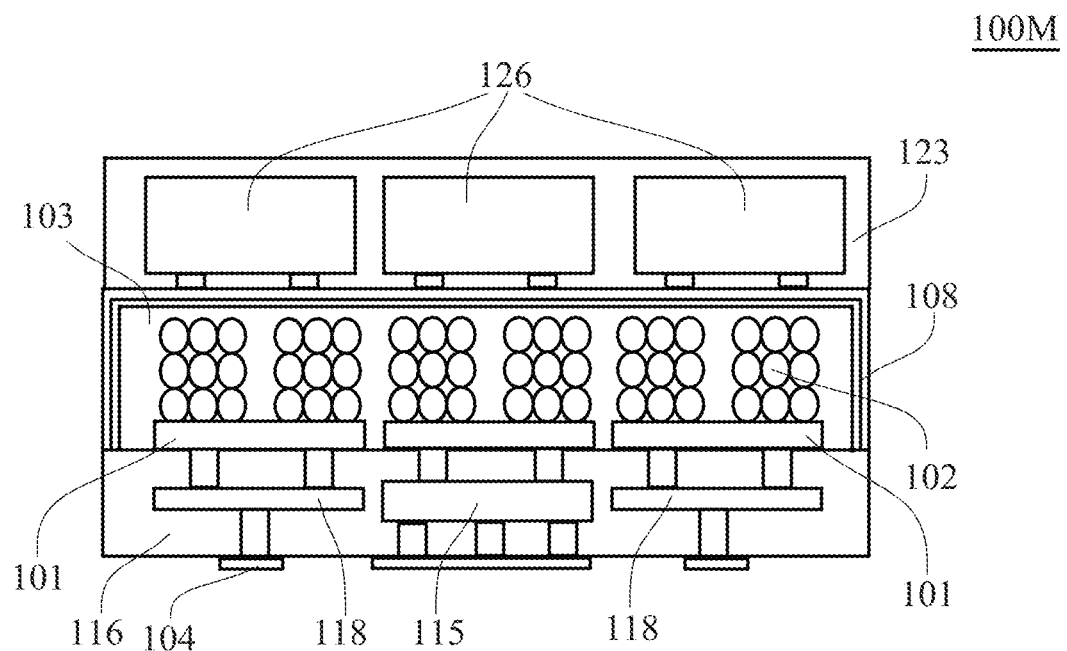

FIG. 7A illustrates a schematic cross-sectional view of an electronic module 100J in another embodiment of the present invention. Compared to the electronic module 100F in FIG. 6A, at least one second device 126 (e.g., passive component) can be disposed in the top portion of the electronic module 100J by a second RDL (Redistribution Layer) process to design the circuit the customers need. FIG. 7B illustrates a schematic cross-sectional view of an electronic module 100K in another embodiment of the present invention. Compared to the electronic module 100G in FIG. 6B, at least one second device 126 (e.g., passive component) can be disposed in the top portion of the electronic module 100K by a second RDL process to design the circuit the customers need. Optionally, the second molding body 123 can be disposed on at least one second device 126 to encapsulate at least one second device 126 in the electronic module 100L, 100M in FIG. 7C and FIG. 7D. The second molding body 123 can be formed by transfer molding or hot pressing.

The shielding layer 107 in FIG. 3A and FIG. 3B or EMC molding 108 in FIG. 4A and FIG. 4B can be disposed in the electronic module 100J, 100K, 100L, 100M in FIG. 7A to FIG. 7D (not shown). In this case, the shielding layer 107 or EMC molding 108 can be extended to the lateral surfaces of the substrate 101, the lateral surfaces of the first molding body 103, the lateral surfaces of the RDL body 116 or the lateral surfaces of the second molding body 123 to encapsulate the lateral surfaces of the substrate 101, the lateral surfaces of the first molding body 103, the lateral surfaces of the RDL body 116 or the lateral surfaces of the second molding body 123. Moreover, the gap 110 can be formed between the adjacent coils 102 to reduce interaction of the adjacent coils 102 resulting from closeness in FIG. 7A to FIG. 7D (not shown).

Figure 8A:
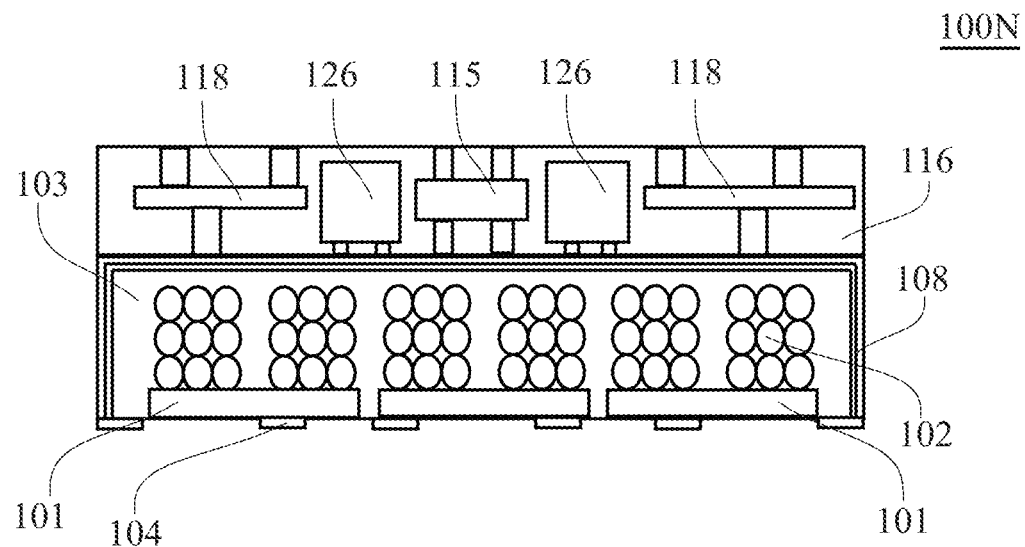
FIG. 8A and FIG. 8B respectively illustrates a schematic cross-sectional view of an electronic module in another embodiment of the present invention, wherein at least one first device and at least one second device are integrated in the RDL (Redistribution Layer) body.
Figure 8B:
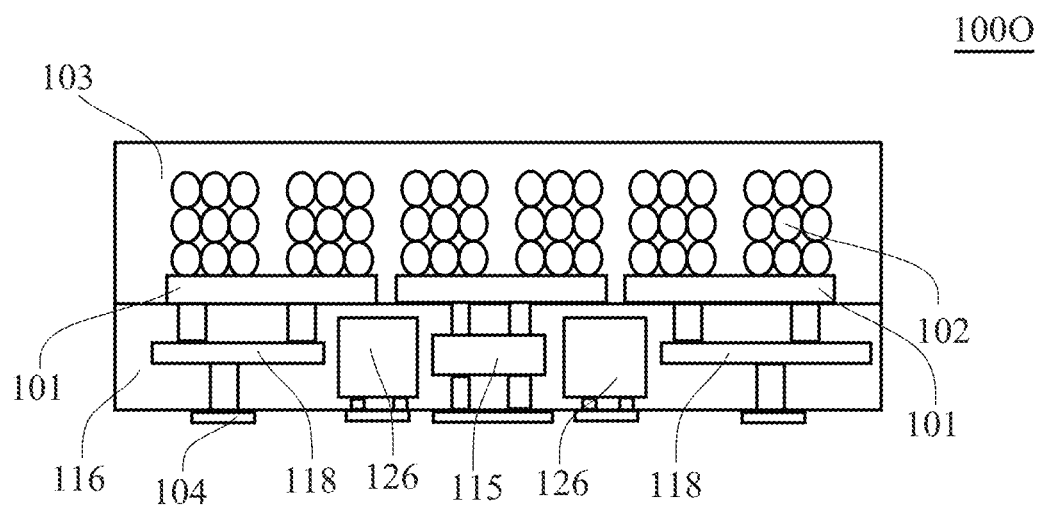

FIG. 8A illustrates a schematic cross-sectional view of an electronic module 100N in another embodiment of the present invention. Compared to the electronic module 100F in FIG. 6A, at least one first device 115 (e.g., bare die) and at least one second device 126 (e.g., passive component) are integrated in the RDL body 116. FIG. 8B illustrates a schematic cross-sectional view of an electronic module 100O in another embodiment of the present invention. Compared to the electronic module in 100G in FIG. 6B, at least one first device 115 (e.g., bare die) and at least one second device 126 (e.g., passive component) are integrated in the RDL body 116.

The shielding layer 107 in FIG. 3A and FIG. 3B or EMC molding 108 in FIG. 4A and FIG. 4B can be disposed in the electronic module 100N, 100O in FIG. 8A to FIG. 8B (not shown). In this case, the shielding layer 107 or EMC molding 108 can be extended to the lateral surfaces of the substrate 101, the lateral surfaces of the first molding body 103 or the lateral surfaces of the RDL body 116 to encapsulate the lateral surfaces of the substrate 101, the lateral surfaces of the first molding body 103 or the lateral surfaces of the RDL body 116. Moreover, the gap 110 can be formed between the adjacent coils 102 to reduce interaction of the adjacent coils 102 resulting from closeness in FIG. 8A to FIG. 8B (not shown).

Figure 9:
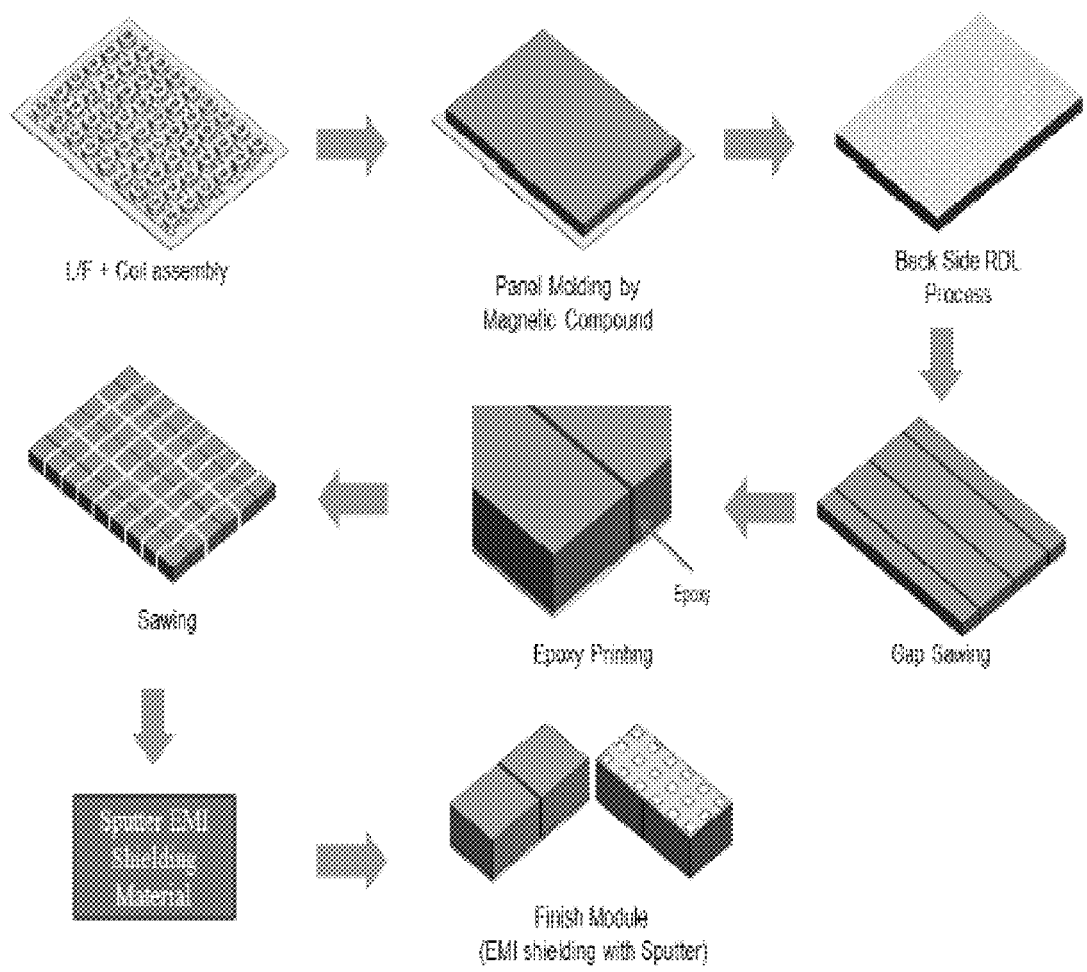
FIG. 9 illustrates a process flow of forming the electronic module in the present invention.

FIG. 9 illustrates a process flow of forming the electronic module in the present invention. After assembling the inductors, dispose the inductors on the substrate. Finish the Panel-Molding structure by transfer molding or hot pressing. Perform the RDL process in the top portion or the bottom portion of the electronic module to form the circuit according to the design requirement of the customers or the circuit. Proceed in substrate-sawing and singulation. Form the shielding layer by sputtering. Finish the manufacturing of the electronic module.

It follows from description of the above embodiments and the method for manufacturing the same can offer many advantages including: (a) coils (inductors) are integrated/modularized and thus they more flexible in design for the customers; (b) active components and passive components can be integrated to shrink the module area; (c) the circuit routing of the electronic module can be the shortest path so as to reduce circuit impedance and improve electrical performance.

The above disclosure is related to the detailed technical contents and inventive features thereof. People skilled in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. An electronic module, comprising:
a substrate, having a top surface and a bottom surface;
a plurality of coils on the top surface of the substrate, wherein each coil comprises a corresponding first end and a corresponding second end; and
a molding body, disposed on the substrate, wherein each of the plurality of coils is encapsulate by a corresponding portion of the molding body, wherein said corresponding first end and said corresponding second end of each coil are electrically coupled to a corresponding first electrode and a corresponding second electrode of the electronic module, wherein said corresponding first electrode and said corresponding second electrode of each coil are disposed on the bottom surface of the substrate.

2. The electronic module according to claim 1, wherein each coil forms an inductor and at least two inductors have two different inductances.

3. The electronic module according to claim 1, wherein each coil is formed by a conductor wire.

4. The electronic module according to claim 1, wherein each coil is formed by at least one conductive layer.

5. The electronic module according to claim 1, wherein the molding body comprises a magnetic material.

6. The electronic module according to claim 1, wherein the molding body comprises a magnetic material that extends into the hollow space of each coil.

7. The electronic module according to claim 1, wherein a magnetic core is disposed inside the hollow space of each coil.

8. The electronic module according to claim 7, wherein said magnetic core is a T-core.

9. The electronic module according to claim 7, wherein said magnetic core is an I-core.

10. The electronic module according to claim 1, wherein the molding body encapsulates lateral surfaces of the substrate.

11. The electronic module according to claim 1, wherein the molding body encapsulates lateral surfaces of the substrate and the partial bottom surface, wherein said electrodes are disposed on the bottom surface of the substrate and exposed from the molding body.

12. The electronic module according to claim 1, wherein at least one conductive layer is disposed on the top surface of molding body, and at least one device is disposed over the top surface of the molding body and electrically connected to the at least one conductive layer.

13. The electronic module according to claim 2, wherein every inductor has a different inductance.

14. The electronic module according to claim 1, wherein at least one conductive layer and at least one insulating layer are disposed on the bottom surface of substrate, and at least one device is disposed in the at least one conductive layer and the at least one insulating layer, wherein the at least one device is electrically connected to the at least one conductive layer, wherein said electrodes are disposed on the bottom surface of said at least one insulating layer.

15. An electronic module, comprising:
a substrate, having a top surface and a bottom surface;
a plurality of coils on the top surface of the substrate, wherein each coil comprises a corresponding first end and a corresponding second end; and
a molding body, disposed on the substrate, wherein each of the plurality of coils is encapsulate by a corresponding portion of the molding body, wherein said corresponding first end and said corresponding second end of each coil are electrically coupled to a corresponding first contact point and a corresponding second contact point, wherein said corresponding first contact point and said corresponding second contact point of each coil are disposed on the bottom surface of the substrate.

16. The electronic module according to claim 15, wherein a gap is formed in the molding body between a first coil and a second coil, wherein a non-magnetic material is disposed in said gap.

17. An electronic module, comprising:
a substrate, having a top surface and a bottom surface;
a plurality of coils on the top surface of the substrate, wherein each coil comprises a corresponding first end and a corresponding second end; and
a molding body, disposed on the substrate, wherein each of the plurality of coils is encapsulate by a corresponding portion of the molding body, wherein said corresponding first end and said corresponding second end of each coil are electrically coupled to a corresponding first electrode and a corresponding second electrode of the electronic module, wherein a gap is formed in the molding body between a first coil and a second coil, wherein a non-magnetic material is disposed in said gap, wherein said gap extends from the top surface of the molding body to the top surface of the substrate.

18. The electronic module according to claim 17, wherein said non-magnetic material is epoxy or metal material.

* * * * *